US006995390B2

(12) United States Patent
Tsukui

(10) Patent No.: US 6,995,390 B2
(45) Date of Patent: Feb. 7, 2006

(54) SWITCHING DEVICE USING SUPERLATTICE WITHOUT ANY DIELECTRIC BARRIERS

(76) Inventor: Katsuyuki Tsukui, 3-17-20, Takasago, Urawa-ku, Saitama-shi, Saitama 330-0063 (JP)

( * ) Notice: Subject to any disclaimer, the term of this patent is extended or adjusted under 35 U.S.C. 154(b) by 0 days.

(21) Appl. No.: 10/440,561

(22) Filed: May 16, 2003

(65) Prior Publication Data

US 2003/0205786 A1 Nov. 6, 2003

Related U.S. Application Data

(63) Continuation-in-part of application No. PCT/JP00/08143, filed on Nov. 17, 2000.

(51) Int. Cl.
*H01L 29/06* (2006.01)

(52) U.S. Cl. .............................. 257/31; 257/32; 257/33; 257/34; 257/35; 257/36

(58) Field of Classification Search ................ None
See application file for complete search history.

(56) References Cited

U.S. PATENT DOCUMENTS

| 5,728,481 A | 3/1998 | Kasai et al. |
| 5,747,859 A | 5/1998 | Mizushima et al. |
| 6,348,699 B1 * | 2/2002 | Zehe ........................... 257/32 |

FOREIGN PATENT DOCUMENTS

| JP | 05145130 | * 6/1993 |
| JP | 10-041124 | 2/1998 |
| JP | 10-341044 | 12/1998 |

OTHER PUBLICATIONS

Yoshio Nishi, "The Future Trends in Electronic Devices," Texas Instruments Incorporated. pp. 11-16.
B. D. Josephson, "Possible New Effects in Superconductive Tunnelling," Physics Letters, vol. 1, No. 7, Jul. 1, 1962, pp. 251-253.
J. G. Bednorz et al., "Possible High Tc Superconductivity in the Ba-La-Cu-O System," Z. Phys. B Condensed Matter 64, 1986, pp. 189-193.
L. Hao et al., "Excess Noise in YBa2 Cu3 07 thin film grain boundary Josephen junctions and devices," Supercond. Sci. Technol. 9. 1996, pp. 678-687.
K. K. Likharev et al., "Fluctuation Spectrum in Superconducting Point Junctions," Moscow State University, ZhETF Pis. Red. 15, No. 10, 1972, pp. 442-445.
M. N. Baibich et al., "Giant Magnetoresistance of (001)Fa/(001) Cr Magnetic Superlattices," The American Physical Society, Physical Review Letters, vol. 61, No. 21, Nov. 21, 1988, pp. 2472-2475.

(Continued)

*Primary Examiner*—Long Pham
*Assistant Examiner*—Wai-Sing Louie
(74) *Attorney, Agent, or Firm*—Mitchell P. Brook, Esq.; Luce, Forward, Hamilton & Scripps LLP

(57) ABSTRACT

A switching device has an S (Superconductor)-N (Normal Metal)-S superlattice to control the stream of electrons without any dielectric materials. Each layer of said Superconductor has own terminal. The superlattice spacing is selected based on "Dimensional Crossover Effect". This device can operate at a high frequency without such energy losses as devices breaking the superconducting state. The limit of the operation frequency in the case of the Nb/Cu superlattice is expected to be in the order of $10^{18}$ Hz concerning plasmon loss energy of the normal metals (Cu; in the order of $10^3$ eV).

12 Claims, 4 Drawing Sheets

The unit cell of the device

OTHER PUBLICATIONS

Nobuyoshi Hosoito et al., "Evidence for Antiferomagnetic Coupling between Fe Layers through Cr from Neutron Diffraction," Journal of the Physical Society of Japan, vol. 59, No. 6, Jun. 1990 pp. 1925-1927.

Cornell S. L. Chun et al., "Dimensional crossover in superlattice superconductors," The American Physical Society, Physical Review B. vol. 29, No. 9, May 1984, pp. 4915-4920.

Katsuyuki Tsukui et al., "Valence spin ordering of the superconducting multilayer below extraordinarily high temperatures," Applied Surface Science 162-163, 2000, pp. 239-244.

L. Esake et al., "Superlattice and Negative Differential Conductivity in Semiconductors,"Communication, IBM J. Res. Develop., Jan. 1970, pp. 61-65.

L. Esaki, "Do-it-yourself Quantum Mechanics in Low-dimensional Structures," Physica. Scripta., vol. T42, 1992, pp. 102-109.

K. F. Renk et al., "Bloch oscillations and nonlinear transport in semiconductor superlattices," Physica B, vol. 244, 1998, pp. 196-200.

Hirohiko Adachi et al., "Discrete Variational Xa Cluster Calculations. I. Application to Metals," Journal of The Physical Society of Japan, vol. 45, No. 3, Sep. 1978, pp. 875-883.

Quantum Mechanics, Approximation Methods for Bound States, pp. 268-279.

Hisao Hayakawa et al., "Fabrication of High Tc Superconductor Tunnel Junctions," Dept. of Electronics, Faculty of Engineering, Nagoya Univ., Furo-cho, Chikusa-ku, Nagoya 464-01, vol. 58, No. 5, 1989. pp. 766-769 (in Japanese, without English Abstract).

Jun Kondo (Kondo effect) "An abstract of metal electron theory," Shokabo Press, 1983, pp. 94-102 (in Japanese, without English abstract).

* cited by examiner

The unit cell of the device

Example of the device

The superlattice spacing is decided by "Dimensional Crossover Effect".
In the case of the Nb/Cu system, the layer thickness of Nb layer and Cu
layer should be 16.8nm and 14.7nm, respectively.

SWITCHING DEVICE USING SUPERLATTICE WITHOUT ANY DIELECTRIC BARRIERS

This is a CIP of PCT/JP00/08143 filed on Jan. 17, 2000.

BACKGROUND OF THE INVENTION

1. Field of the Invention

The present invention relates to a switching device using S-N-S superlattice.

2. Description of the Related Art

Since the discovery of the transistor effect by William Bradford Shockley, John Bardeen and Walter. H. Brattain in 1948, the semiconductor device for computing has generated a tremendous number of concepts related to the revolution of the world. The fastest speed of data processing is required to synchronize with the stream of consciousness. In the field of electronic devices, in order to catch up with such a stream, the circuit elements have been downsized to satisfy the "Scaling Rule", which suggests that the processing speed should be improved by downsizing the circuit assembly, including Field Effect Transistors (FET), to reduce the product of resistivity and capacitance of integrated circuits. However, it is becoming increasingly difficult to meet the contemporary demands of high speed processing by the Scaling Rule. Since the switching operation of the FET is originated from motions of carriers neighboring the gate contact by bias voltage, the switching frequency depends upon the mobility of the carriers. Recently, Y. Nish predicted that the chip frequency would be restricted approximately up to $1.1 \times 10^9$ Hz until the year of 2010 (Y. Nish, Proceedings of International Symposium on Control of Single Particles and its Application (1996)). According to the prediction, the performance of a Central Processing Unit (CPU) should be a little higher than the common units. That is to say that processing inflated amount of information by large-sized software should be restricted by the limit of the mobility of carriers inside semiconductors.

On the other hand, a switching device using superconducting material with a tunneling insulating barrier, predicted by Brian David Josephson, has been known to be a high frequency switching device, which consumes extremely low energy (B. D. Josephson, Phys. Rev. Lett., 1(7)(1962)251). However the Josephson junction device has never been put to practical use because the switching operation beyond a frequency of $7 \times 10^8$ Hz is suffered from chaotic noise. Besides, there are three properties such as attenuation of signals transmitted across the tunneling barrier, delay of signals by parasitic capacitance and mechanical fragility against thermal stress. The oxide superconductor discovered by K. Alex Muller and J. Georg Bednorz (K. Alex Muller and J. Georg Bednorz, Zeitschrift fur Physik, B64(1986)189), which is able to operate at higher temperature, has been introduced to the switching device. In spite of a lot of trial, switching devices using an oxide superconductor have never been practically used because of their own property. In this paper, we propose that we can solve all problems by using a metal superconductor superlattice.

There are two reasons why the oxide superconductor has never been applied to practical Josephson devices. First, the phase change of the wave function should be fluctuated by the existence of incoherent interfaces such as the grain boundaries. Second, it is difficult to integrate the device because of the low transmittance rate of the wave function across such incoherent interfaces. Coherent length of the oxide superconductor is designed to be shortest (shorter than 0.1 nm) to raise the superconducting critical temperature Tc (H. Hayakawa and Y. Takagi, Oyo Butsuri (in Japanese), 58(5)(1989)766). Such short coherent length is realized by inserting ionic layers with high electric polarization as the partitions of the coherent region. Accordingly, the delay of wave function between conducting layers cannot be avoided (FIG. 1A). Besides, the delay should not be uniform in the region neighboring the incoherent interface (FIG. 1B). By such rack of uniformity, thermal noises are preference beyond the switching frequency of $10^4$ Hz (L. Hao, J. C. MacFarlane, C. M. Pegrum, Supercond. Sci. Technol., 9(1996)678) and dynamical impedance of the interface is increased (K. K. Likharev and V K. Semenov, JETP. Lett., 15(1972)3537), therefore, transmittance of the wave function is lowered in the high frequency region. This means that these problems cannot be essentially solved by partitioning the coherent region by using dielectric material.

Superconductivity is decided by coherence of wave function of the Cooper pair, and the coherence is realized by spin exchange correlation. This means we can solve the problem of partitioning the conducting region by controlling spin exchange correlation. Then we are going to try to understand the mechanism of the Giant Magneto-Resistance (GMR) as an example of artificial control of spin exchange correlation. It is reported that GMR is realized in the metal system in a mesoscopic scale and resistivity is lowered by 50% in the applied magnetic field (eg. M. N. Baibich, J. M. Broto, A. Fert, F. Nguyen Van Dau, F. Petroff, P. Etienne, G. Creuzet, A. Friederich and J. Chazelas, Phys. Rev. Lett., 61(1988) 2472). GMR is originated from the fact that transition of itinerant electrons between the ferro-magnetic layers is restricted when the wave function considering spin direction is opposite to the next layer (Kondo effect (Jun Kondo, "An abstract of metal electron theory" (in Japanese), Shokabo Press (1983))). The experimental result on the spin ordering in the system revealing GMR has already been reported (N. Hosono, S. Araki, K. Mibu and T. Shinjo, J. Phys. Soc. Jpn., 59(6)(1990)1925). According to this report, the half-ordered reflection, which is the proof of spin ordering in the scale of the superlattice spacing, can be observed in the experiment of the neutron diffraction.

It should be emphasized that the well-controlled magnetic domain can be realized in the mesoscopic system by control of the superlattice spacing. This suggests that transition of itinerant electrons can be controlled by tuning the spacing of strongly correlated layers without inserting any dielectric insulator. According to this suggestion, we can also design the superlattice using correlated materials such as superconductor without any dielectric materials.

SUMMARY OF THE INVENTION

An object of the present invention is to provide superconductor without any dielectric materials.

Another object of the present invention is to provide a switching device being operable at a high speed.

To achieve the objects, there is provided a superconducting switching device having a Superconductor/Metal/Superconductor superlattice.

DETAILED DESCRIPTION OF THE PREFERRED EMBODIMENT

In the system of Superconducting metal-Normal metal-Superconducting metal (S-N-S) superlattice, the dimensional crossover effect has been reported. The group of Ivan K. Schuller et. al. has investigated the effect in the Nb/Cu system. According to their reports (Cornel S. L. Chun, Guo-Guang Zheng, Jose L. Vincent, and Ivan K. Schuller, Phys Rev., B29(9)(1984) 4915), the coherent length of the Nb/Cu superlattice is anisotropic only under severe conditions in the mesoscopic system, and the correlation between superconducting layers should be maximized if the superlattice spacing is appropriated.

Figures 1A, 1B:
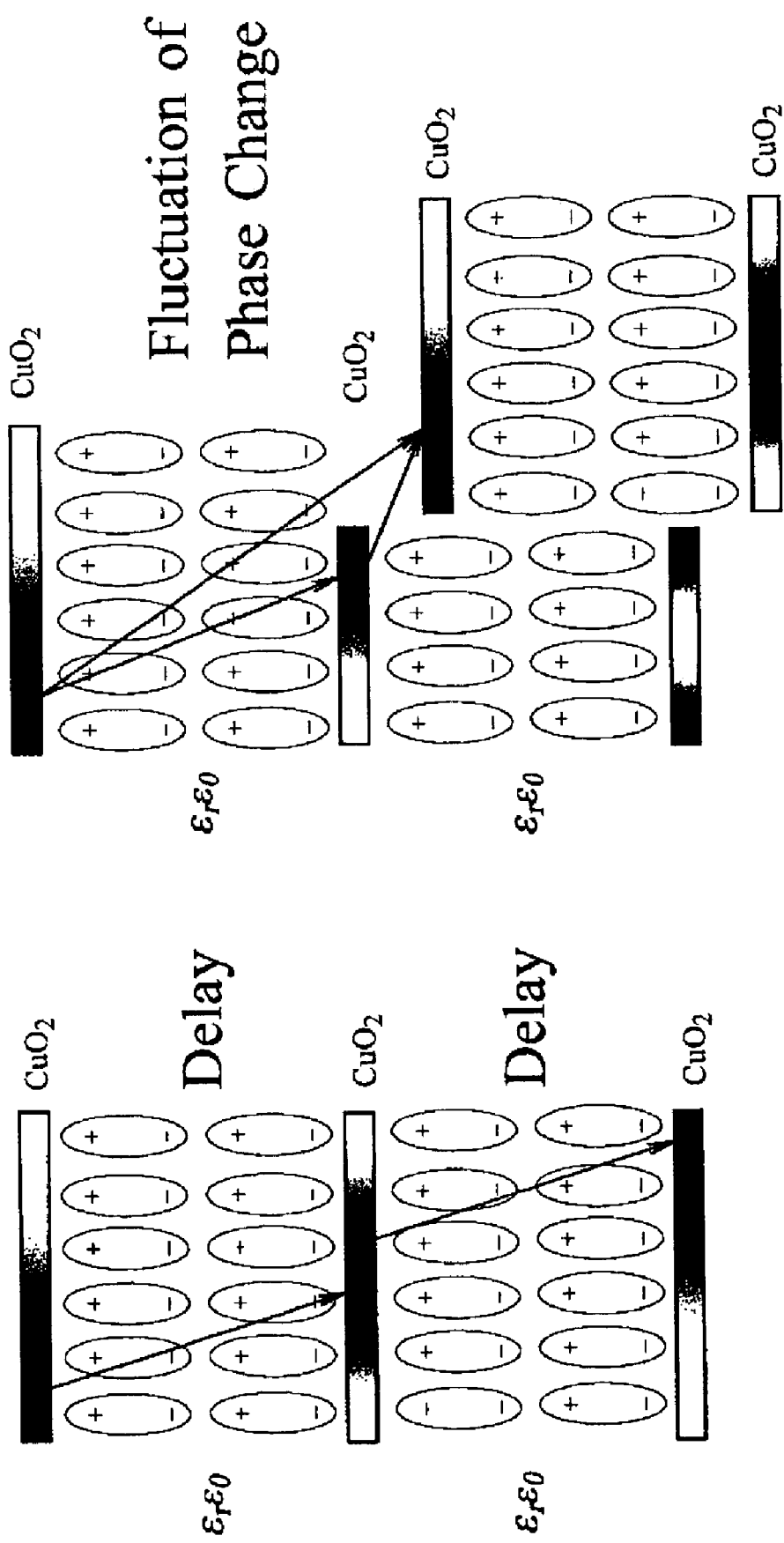
FIG. 1A shows the influence of electric polarization inside the oxide superconductor during the propagation of the wave function between the conducting layers. In case of the Josephson device using a oxide superconductor, the thermal noise is preferentially beyond the switching frequency of $10^4$ Hz. According to the report by K. K. Likharev, such thermal noise is caused by the increase of dynamic impedance in the high frequency region. That is to say there exists a high amount of electric polarization inside the crystal of Perovskite structure. Furthermore, the wave function should be delayed by electric polarization.
FIG. 1B shows the schematic diagram showing the phase change neighboring the incoherent interfaces. The ordering parameter should naturally be lowered by the delay of the wave function and the coupling of the wave function should be weak.
Figure 2:
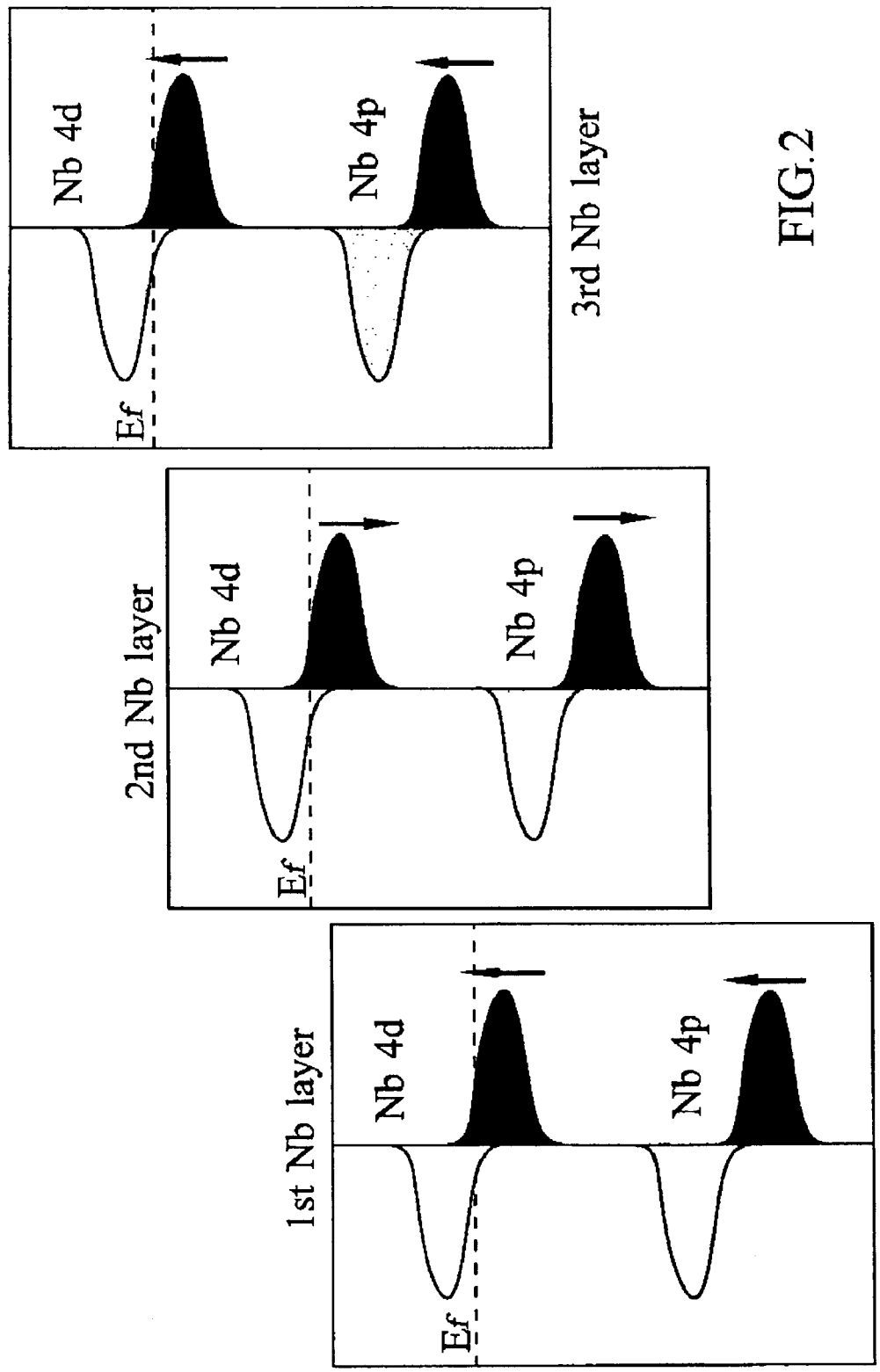
FIG. 2 shows the layer-by-layer anti-ferromagnetic spin arrangement concluded by the experiment of the resistivity measurement. The electronic states in each layer were simulated by the ab-initio Linear Combination of Atomic Orbital calculation (Discrete Variational Xα approximation (H. Adachi, M. Tsukada and C. Satoko, J. Phys. Soc. Jpn., 45(1978)875)). Since spin fluctuation according to the mechanism of "thermal stabilization mechanism of the Cooper pair" 11 is independent from the normal electronic state, we can treat the mesoscopic spin arrangement schematically using the normal electronic state. The spin direction in the next layer should be opposite in order to lower the total energy described by the function of the exchange correlation parameter. If such anti-ferromagnetic arrangement is realized in the system of the superconductor, the stream of electrons should be divided without dielectric materials.

Recently we reported on the layer-by-layer anti-ferromagnetically spin ordering in the Nb/Cu system on a mesoscopic scale (K. Tsukui, M. Yata, I. Ohdomari, T Osaka N. Yagi and H. Tsukui, Appl. Surface Sci., 162–163(2000)239–244). An anomalous increase of the resistivity was observed with high reproducibility as a result of the resitivity measurements in the system of the Nb/Cu superconducting superlattice, whose spacing is fixed to be 16.8 nm and 14.7 nm, respectively, in order to maximize the interlayer spin exchange correlation. Taking the fact into account that the anomaly was observed only when the interlayer correlation was maximized, we concluded that the anti-ferromagnetic arrangement of the electron band should be realized in the mesoscopic scale and the anomaly should be ascribed to the transition of the itinerant electrons described by Kondo effect (FIG. 2).

If such anti-ferromagnetic ordering is also realized in a superconductor system, the analogy of the superconducting phenomena and GMR should be concluded. As described above, the stream of electrons is divided without a dielectric insulator in the system revealing GMR, therefore, the transition of Cooper pairs in the system of the S-N-S superlattice should be controlled without any dielectric materials.

4-Probes Switching Device of the Preferred Embodiment

Figure 3A:
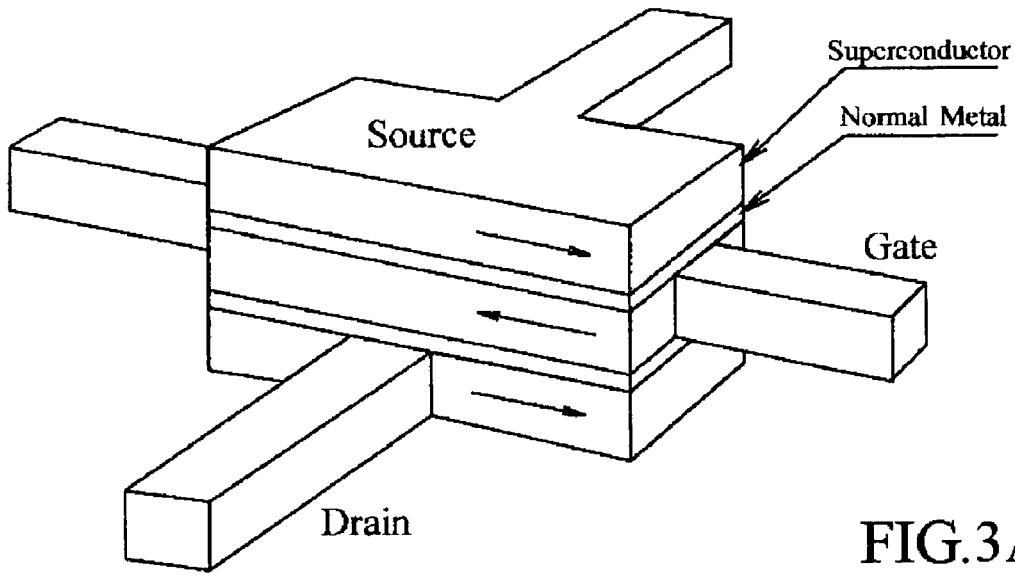
FIG. 3A shows the schematic diagram of unit cell of the 4-probe switching device. The transition between the layers whose wave functions considering spin directions are identical is preferential. As a result of Kondo effect, the transition to the next layer is restricted.
Figure 4:
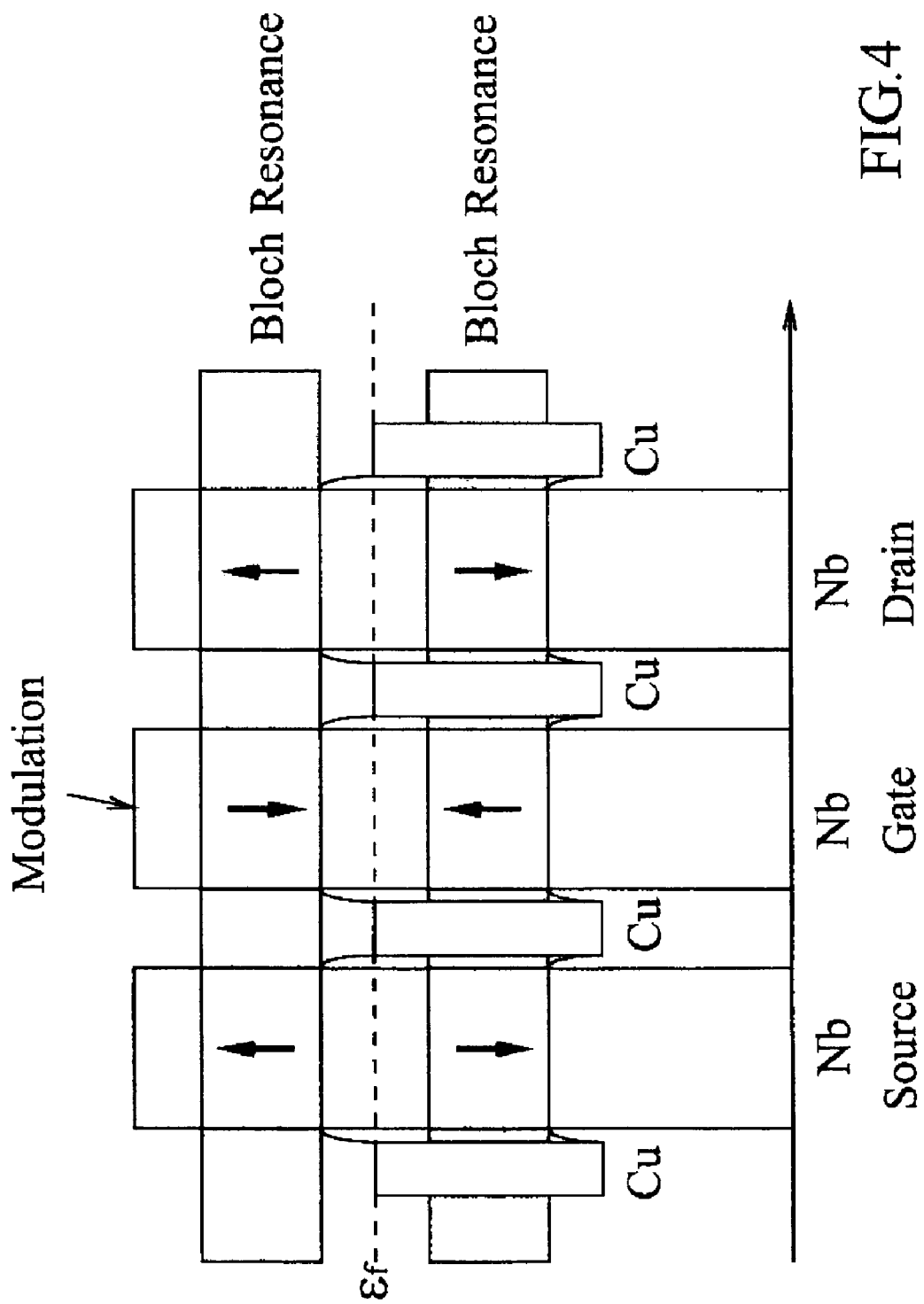
FIG. 4 shows the schematic diagram of the energy band inside of the unit cell of the proposed 4-probe device. As described previously, spin fluctuation according to the mechanism of "thermal stabilization of the Cooper pair" is independent from the normal electronic state, therefore, we can treat the mesoscopic spin arrangement schematically using the normal state. The normal state inside of the superconducting layers are arranged anti-ferromagnetically in the mesoscopic scale and are separated by the electronic states of the normal metal layers. As a result of Kondo effect and/or "Tunneling barrier effect (in the text)", Bloch resonance is accomplished.

FIG. 3A shows the schematic diagram of a unit cell of a 4-probes (4-terminals) switching device. The transition of the electrons between the correlated layers should be preferential and the transition to the next layer should be restricted by the anti-ferromagnetic spin arrangement. Based on this philosophy, a 4-probe device with a source, a gate and a drain has been proposed by the author (K. Tsukui). The principle of switching operation is based on the modulation of the Bloch resonance, (L. Esaki and R. Tsu, IBM research Note, RC-2418 (1969) L. Esaki and R. Tsu, IBM J. Res. Develop., 14(1970)61; L. Esaki, Physica Scripta, T42(1992) 103) and nonlinear transport due to Bloch resonance. As described in FIG. 4, the occupied electronic states with different spin directions of superconducting layers are separated by normal metal layers in the same way as the semiconductor superlattice. Electrons inside of the superlattice are resonated and the resonance state could be modulated by the gate operation or single events introduced from the external environment. As a result of the modulation of Bloch resonance, the Source-Drain voltage has continuous values originated from the nonlinear transport property of the superlattice (K. F. Renk, E. Schomburg, A. A. Ignatov, J. Grenzer, S. Winnerl, K. Hofbeck, Physica, B244(1998)196), which is all the same as the case of the semiconductor superlattice except the treatment of tunneling barriers. In the case of S-N-S structure, the itinerant electrons are transmitted through the paramagnetic metal layers. However the transition from the initial superconducting layer to the final superconducting layer is highly restricted by the spin direction at the lower temperature according to Kondo effect. The resistivity of itinerant electrons ($\rho\uparrow$) is decided by the equation below.

$$\rho_\uparrow = \rho_0 \pi^2 (N_{Para}(\varepsilon_F))^2 J^2 S(S+1)\left(1 - 4N_{Para}(\varepsilon_F) J \log\frac{k_B T}{D}\right)$$

Resistivity is a function of both temperature and electron density at the Fermi level of the inserted paramagnetic metal ($N_{para}(\epsilon_F)$). Transition probability of itinerant electrons is very low at low temperatures below 100K, therefore, inserted paramagnetic metal serves as an insulator, which can be treated as the band gap in the case of semiconductor superlattices. This "tunneling barrier effect" has been authorized to be adapted to the case of the paramagnetic layer with a different angular momentum which is inserted between the spin-exchange-correlated layers (L. I. Schiff, "Quantum Mechanics" (Second Edition), McGraw-Hill (1955)). Consequently, this device can be operated while maintaining the superconducting current by Bloch resonance, therefore, the operation is independent of the frequency limit decided by the gap energy in the case of the conventional RC-type Josephson junction.

Figure 3B:
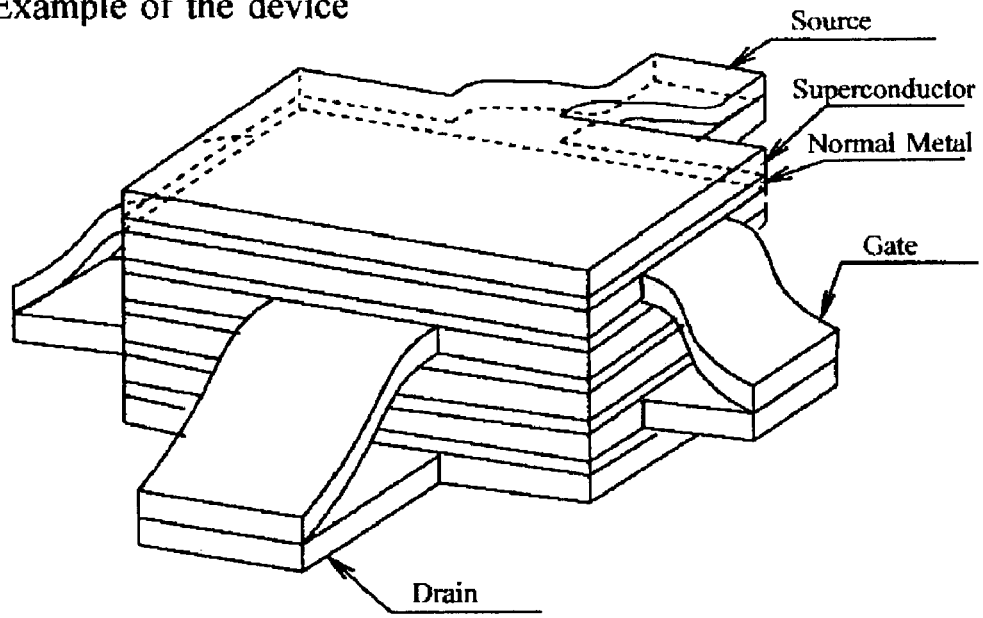
FIG. 3B shows the schematic diagram of the 4-probe device constructed by source layers, gate layers and drain layers. The switch should be turned off, if Bloch resonance is modulated by the gate operation or by single events from the external environments. By considering the analogy between superconducting phenomena and GMR, the stream of electrons should be divided without any dielectric materials. This device could be made from another kind of spin-exchange-correlated materials.

Furthermore, the correlation between the source layers and the drain layers can be summated to the unity because the basic units, as mentioned before, are stacked into multilayers in the order of Source(S)/Gate(G)/Drain(D)/G/S/G/D/G or S/G/D/S/G/D as shown in FIG. 3B. For example, the sources are connected with each other, the gates are connected with each other, the drains are connected with each other, thereby solving the problem of transmittance. Consequently, all problems related to the practical use of the superconductor device are solved by using this device. It is possible to operate this device at extremely high frequency without such energy losses as the RC-type switching devices because superconducting state is not destroyed. The limit of the operation frequency in the case of the Nb/Cu superlattice is expected to be in the order of $10^{18}$ Hz concerning plasmon loss energy of the normal metals (Cu; in the order of $10^3$ eV). If such high frequency operation could be possible, the electrical pulse could be transformed into photons and incident photons and high-energy particles could be detected as electric pulses.

As stated above, we have discussed on the aspect that the operation of the CPU at higher frequency by other ways than integrating the circuits according to the Scaling Rule. In order to fabricate extremely high frequency switching devices using superconductors, we should get rid of the parasitic capacitance (electric polarization) neighboring the junction. As an example of such a device, we proposed a 4-probe device using the S-N-S superlattice to control the stream of electrons without any dielectric materials.

The contents of the cited references are incorporated herein by reference in their entirety.

This application is based on International Patent Application No. PCT/JP00/08143 filed on Nov. 17, 2000 and amendments under Patent Cooperation Treaty articles 19 and 34 filed for the above-noted International Patent Application. The disclosure of the International Patent Application and the amendments are incorporated herein by reference in their entirety.

What is claimed is:

1. A superconducting switching device having a
   a first superconductor layer (Nb layer; source) serving as one end of current path (source drain current path),
   a first normalconductor layer (Cu layer) formed on said first superconductor layer,
   a second superconductor layer (Nb layer; gate) formed on said first normalconductor layer and serving as a control electrode for controlling the on and off of the current path,
   a second normalconductor layer (Cu layer) formed on said second superconductor layer, and
   a third superconductor layer (Nb layer; drain) formed on said second normalconductor layer serving as another end of the current path.

2. The superconducting switching device according to claim 1, wherein each of said first, second, and third superconductor layers has its own terminal.

3. The superconducting switching device according to claim 1, wherein each of said first to third superconductor layers and said first and second normalconductor layers has such thickness as electrons in said first to third superconductor layers are resonated.

4. The superconducting switching device according to claim 3, wherein each of said first, second, and third superconductor layers comprises an Nb layer, and each of said first and second normalconductor layers comprises a Cu layer, the thickness of the Nb layer and Cu layer are 16.8 nm and 14.7 nm, respectively.

5. The superconducting switching device according to claim 4, wherein said first superconductor layer has a source terminal and serves as a source layer, said second superconductor layer has a gate terminal and serves as a gate layer, and said third superconductor layer has a drain terminal and serves as a drain layer.

6. The superconducting switching device according to claim 5, wherein said first and second normalconductor layers comprise metal layers.

7. The superconducting switching device according to claim 5, wherein electrical resistance between said first superconductor layer and said third superconductor layer is controlled by the electronic state of the gate layer and/or single events introduced from the external environment.

8. The superconducting switching device according to claim 1, wherein electrical resistance between said first superconductor layer and said third superconductor layer is controlled by the electronic state of the gate layer and/or single events introduced from external environment.

9. The superconducting switching device according to claim 4, wherein a Source-Drain voltage reveals one of multi-value in accordance with the electronic state of the sate layer and/or single events introduced from external environment.

10. The superconducting switching device according to claim 1, including a plurality of unit cells each having said first, second, and third superconductor layers and said first and second normalconductor layers.

11. The superconducting switching device according to claim 10, wherein said first superconductor layer of the plurality of unit cells are connected with each other, and said second superconductor layer of the plurality of unit cells are connected with each other, and said third superconductor layer of the plurality of unit cells are connected with each other.

12. A switching device characterized by having
    a first superconductor layer (Nb layer; source) serving as one end of current path (source drain current path),
    a first metal layer (Cu layer) formed on said first superconductor layer,
    a second superconductor layer (Nb layer; gate) formed on said first metal layer and serving as a control electrode for controlling the on and off of the current path,
    a second metal payer (Cu layer) formed on said second superconductor layer,
    a third superconductor layer (Nb layer; drain) formed on said second metal layer serving as another and of the current path, a third metal layer (Cu layer) formed on said third superconductor layer, a fourth superconductor layer (Nb layer; source) formed on said third metal layer, serving as one end of current path (source drain current path), and connected to said first superconductor layer, a fourth metal layer (Cu layer) formed on said first superconductor layer, a fifth superconductor layer (Nb layer; gate) formed on said fourth metal layer, serving as a control electrode for controlling the on and off of the current path, and connected to said second superconductor layer, a fifth metal layer (Cu layer) formed on said fifth superconductor layer, and a sixth superconductor layer (Nb layer; drain) formed on said fifth metal layer, serving as another end of the current path and connected to third superconductor layer.

* * * * *